US012718861B2

(12) United States Patent
Villa

(10) Patent No.: US 12,718,861 B2
(45) Date of Patent: Aug. 25, 2026

(54) MEMORY CELL ARRANGEMENT AND METHOD OF READING A CAPACITIVE MEMORY CELL

(71) Applicant: Ferroelectric Memory GmbH, Dresden (DE)

(72) Inventor: Corrado Villa, Sovico (IT)

(73) Assignee: Ferroelectric Memory GmbH, Dresden (DE)

( * ) Notice: Subject to any disclaimer, the term of this patent is extended or adjusted under 35 U.S.C. 154(b) by 111 days.

(21) Appl. No.: 18/830,665

(22) Filed: Sep. 11, 2024

(65) Prior Publication Data

US 2026/0073963 A1 Mar. 12, 2026

(51) Int. Cl.
*G11C 11/22* (2006.01)
*G11C 5/06* (2006.01)

(52) U.S. Cl.
CPC .......... *G11C 11/2273* (2013.01); *G11C 5/063* (2013.01); *G11C 11/221* (2013.01); *G11C 11/2297* (2013.01)

(58) Field of Classification Search
CPC ... G11C 11/2273; G11C 5/063; G11C 11/221; G11C 11/2297
USPC .................................................. 365/189.011
See application file for complete search history.

(56) References Cited

U.S. PATENT DOCUMENTS

2020/0058341 A1* 2/2020 Villa .................. G11C 11/2257
2023/0402083 A1* 12/2023 Schenk ............... G11C 11/2259
2025/0131954 A1* 4/2025 Sivero .................. G11C 11/221
2025/0266068 A1* 8/2025 Jeong .................... G11C 11/221

* cited by examiner

*Primary Examiner* — Ly D Pham
(74) *Attorney, Agent, or Firm* — Natalie Albrecht

(57) ABSTRACT

Various aspects relate to a memory cell arrangement including: bitlines; wordlines; platelines; capacitive memory cells, wherein each of the capacitive memory cells is connected to and selectively addressable by a corresponding bitline, a corresponding wordline, and a corresponding plateline; a control circuit configured to carry out a read-out operation to read a memory state of a capacitive memory cell, the read-out operation including: charging the corresponding bitline to a first characteristic voltage by applying a plateline voltage having a first plateline voltage value at the corresponding plateline and by applying a wordline voltage at the corresponding wordline; decreasing the plateline voltage from the first plateline voltage value to a second plateline voltage value to thereby discharge the corresponding bitline from the first characteristic voltage to a second characteristic voltage; and determining the memory state of the capacitive memory cell based on sensing the second characteristic voltage.

20 Claims, 10 Drawing Sheets

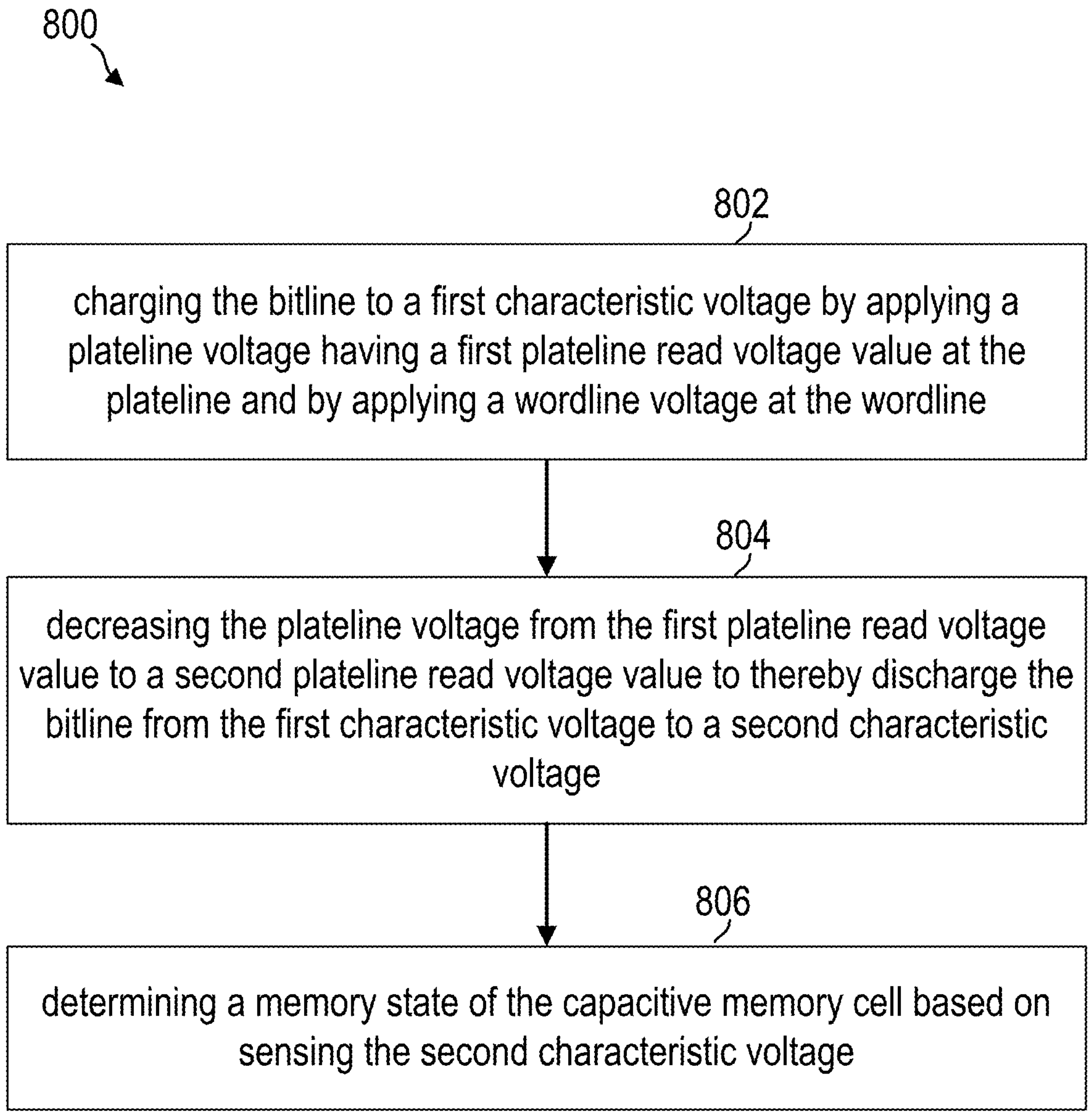

802 charging the bitline to a first characteristic voltage by applying a plateline voltage having a first plateline read voltage value at the plateline and by applying a wordline voltage at the wordline

804 decreasing the plateline voltage from the first plateline read voltage value to a second plateline read voltage value to thereby discharge the bitline from the first characteristic voltage to a second characteristic voltage

806 determining a memory state of the capacitive memory cell based on sensing the second characteristic voltage

MEMORY CELL ARRANGEMENT AND METHOD OF READING A CAPACITIVE MEMORY CELL

TECHNICAL FIELD

Various aspects relate to a memory cell arrangement and a method of reading a capacitive memory cell.

BACKGROUND

In general, various computer memory technologies have been developed in semiconductor industry. A fundamental building block of a computer memory may be referred to as memory cell. The memory cell may be an electronic circuit that is configured to store at least one information (e.g., bitwise). As an example, the memory cell may have at least two memory states representing, for example, a logic "1" and a logic "0". In general, the information may be maintained (stored) in a memory cell until the memory state of the memory cell is modified, e.g., in a controlled manner. The information stored in the memory cell may be obtained (read out) by determining in which of the memory states the memory cell is residing in. At present, various types of memory cells may be used to store data. By way of example, a type of memory cell may include a thin film of a spontaneous-polarizable material, e.g., a ferroelectric material or a configuration of an anti-ferroelectric material, whose polarization state may be changed in a controlled fashion to store data in the memory cell, e.g., in a non-volatile manner. A memory cell or an arrangement of memory cells may be integrated, for example, on a wafer or a chip together with one or more logic circuits.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which:

FIG. 8 shows a flow diagram of a method of reading a memory cell according to various aspects.

DESCRIPTION

Figure 1:
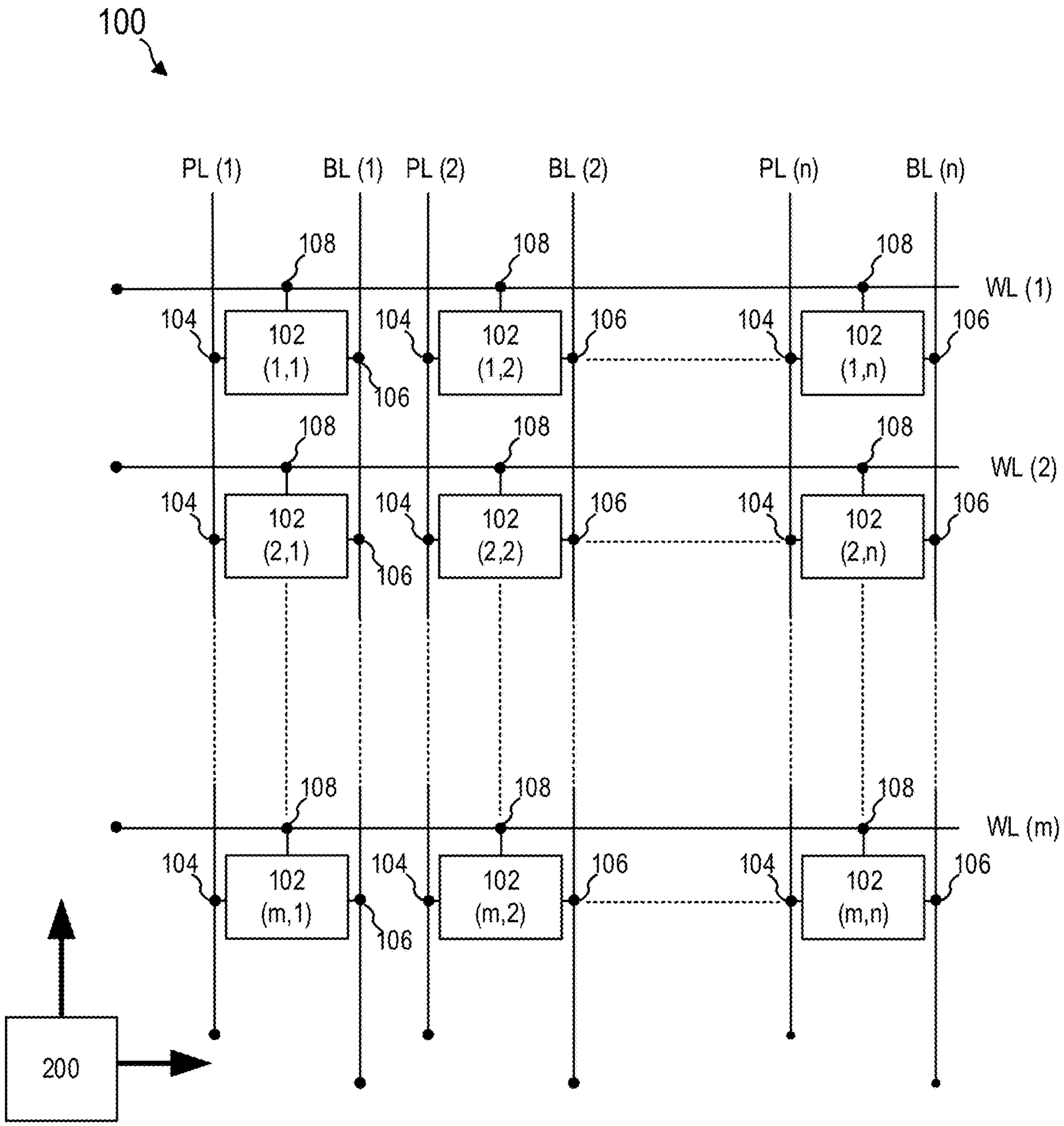
FIG. 1 shows an exemplary memory cell arrangement including a plurality of memory cells and various control lines for addressing the plurality of memory cells.

The following detailed description refers to the accompanying drawings that show, by way of illustration, specific details and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects may be combined with one or more other aspects to form new aspects. Various aspects are described in connection with methods and various aspects are described in connection with devices (e.g., a memory cell, or a memory capacitor). However, it may be understood that aspects described in connection with methods may similarly apply to the devices, and vice versa.

In general, a memory state of a selected (state-programmable) capacitive memory cell may be written by applying a wordline voltage $V_{WL}$ at a wordline connected to the memory cell (to open its access device) and by applying a write voltage $V_{write}$ at a bitline and/or plateline connected to the memory cell, such as by applying a bitline write voltage $V_{BL,write}$ at the bitline (and, for example, 0 V at the plateline) to write the memory cell into a logic "1" or applying a plateline write voltage $V_{PL,write}$ at the plateline (and, for example, 0 V at the bitline) to write the memory cell into a logic "0". The effective voltage $V_{SPOC}$ over the capacitive memory element of the memory cell results from the difference between the bitline voltage $V_{BL}$ and the plateline voltage $V_{PL}$ (i.e., during writing $V_{SPOC}=V_{write}$).

To read the memory state of the selected (state-programmable) capacitive memory cell, the wordline voltage $V_{WL}$ may be applied at the wordline and a plateline read voltage $V_{PL,read}$ may be applied at the plateline to thereby charge the bitline to a characteristic voltage that depends on the memory state of the memory cell. Thus, during reading, the effective voltage $V_{SPOC}$ over the capacitive memory element may be given by: $V_{SPOC}=V_{PL,read}-V_{BL}$. To achieve during reading the same effective voltage $V_{SPOC}$ as during writing, the plateline read voltage $V_{PL,read}$ has to be greater than the plateline write voltage $V_{PL,write}$, in particular $V_{PL,read}=V_{PL,write}+V_{BL}$ (with the bitline voltage $V_{BL}$ representing the characteristic voltage $V_{char}$). In a memory cell arrangement, additional, non-selected memory cells (i.e., memory cells having their access device closed) may also be connected to the plateline and to the bitline the selected memory cell is connected to. The increased plateline voltage $V_{PL}$ causes (additional) stress on the respective access device (e.g., access transistor) of each of the non-selected memory cells (since the access transistor may have the plateline read voltage $V_{PL,read}$, at its drain terminal and the base (e.g., ground) voltage at its source terminal). A large (additional) stress is induced in the case that the selected memory cell stores a logic "0" as memory state since, as soon as the sense amplifier completes the sensing of the characteristic voltage and determination of the memory state, the bitline BL goes (e.g., is discharged) to the base voltage, $V_B$, (see, for example, FIG. 6A), thereby changing the effective voltage $V_{SPOC}$ over the memory element from $V_{SPOC}=V_{PL,read}-V_{char}$ (with $V_{char}=V_0$ in the case that the memory cell stores a logic "0") to $V_{SPOC}=V_{read}-V_B=V_{read}$. Thus, during reading the selected memory cell, the (increased) plateline voltage $V_{PL}$ stresses directly the capacitive memory element of the selected memory cell (while stressing the respective access device of each of the non-selected memory cells at the same time).

According to various aspects, after the bitline BL has been charged to the characteristic voltage $V_{char}$ using the plateline read voltage $V_{PL,read}=V_{PL,write}+V_{BL}$ as plateline voltage, the plateline voltage $V_{PL}$ is reduced to (i.e., the plateline PL is discharged to) a plateline discharge voltage $V_{PL,d}$. In some aspects, the plateline discharge voltage $V_{PL,d}$ may be the plateline write voltage $V_{PL,write}$ (i.e., $V_{PL,d}=V_{PL,write}$). This prohibits the above detailed (additional) stress on the memory cells that store a logic "0" as memory state since, once the bitline BL goes (e.g., is discharged) to the base voltage, $V_B$, (see, for example, FIG. 6A), the effective voltage $V_{SPOC}$ over the memory element is $V_{SPOC}=V_{PL,d}$ (instead of $V_{SPOC}=V_{PL,write}+V_{BL}$). Besides reducing the maximum effective voltage $V_{SPOC}$ over the memory element, also the time duration for which the (high) plateline read voltage $V_{PL,read}$ is applied is reduced, thereby further reducing the stress on the memory element. When taking a same stress over the memory element into account, the above detailed read-out operation allows for a greater read voltage without increasing a reliability of the memory cell.

Various aspects relate to a memory cell arrangement including: a plurality of bitlines; a plurality of wordlines; a plurality of platelines; a plurality of capacitive memory cells, wherein each capacitive memory cell of the plurality of capacitive memory cells is connected to and selectively addressable by a corresponding bitline of the plurality of bitlines, a corresponding wordline of the plurality of wordlines, and a corresponding plateline of the plurality of platelines; a control circuit configured to carry out a read-out operation to read out a memory state of a capacitive memory cell of the plurality of capacitive memory cells by addressing the capacitive memory cell via its corresponding bitline, corresponding wordline, and corresponding plateline, the read-out operation including: charging the corresponding bitline to a first characteristic voltage by applying a plateline voltage having a first plateline read voltage value at the corresponding plateline and by applying a wordline voltage at the corresponding wordline; decreasing the plateline voltage from the first plateline read voltage value to a second plateline read voltage value to thereby discharge the corresponding bitline from the first characteristic voltage to a second characteristic voltage; and determining the memory state of the capacitive memory cell based on sensing the second characteristic voltage.

A memory cell arrangement is usually configured in a matrix-type arrangement, wherein columns and rows define the addressing of the memory cells according to the control lines connecting respectively subsets of memory cells of the memory cell arrangement along the rows and columns of the matrix-type arrangement. However, other arrangements may be suitable as well. In general, a memory cell arrangement may include a plurality of (e.g., volatile or non-volatile) memory cells, which may be accessed individually or on groups via a corresponding addressing scheme. The matrix architecture may be, for example, referred to as "OR", "AND", "NOR", or "NAND" architecture, depending on the way neighboring memory cells are connected to each other, i.e., depending on the way the terminals of neighboring memory cells are shared, but are not limited to these two types (another type is for example an "AND" architecture). For example, in a NAND architecture the memory cells may be organized in sectors (also referred to as blocks) of memory cells, wherein the memory cells are serially connected in a string (e.g., source and drain regions are shared by neighboring transistors), and the string is connected to a first control line and a second control line. For example, groups of memory cells in a NAND architecture may be connected in series with one another. In a NOR architecture the memory cells may be connected in parallel with one another. A NAND architecture may thus be more suited for serial access to data stored in the memory cells, whereas a NOR architecture may be more suited for random access to data stored in the memory cells.

FIG. 1 shows an exemplary memory cell arrangement 100 including a plurality of memory cells 102 (m=1 to M, n=1 to N). In the following, various aspects are detailed with reference to the memory cell arrangement 100. It is understood that the memory cell arrangement 100 serves as an exemplary memory cell arrangement to illustrate those aspects and that the memory cell arrangement may have any other suitable configuration.

The plurality of memory cells 102 (m=1 to M, n=1 to N) may be arranged an array of N times M. "N" may be any integer number equal to or greater than one. "M" may be any integer number equal to or greater than one. In some aspects, the memory cell arrangement 100 may be in a ferroelectric random-access memory (FeRAM) configuration.

The memory cell arrangement 100 may include a plurality of bitlines BL(n=1 to N), a plurality of platelines PL(n=1 to N), and a plurality of wordlines WL(m=1 to M) for (individually and selectively) addressing the plurality of memory cells 102 (m=1 to M, n=1 to N). Each memory cell 102 (m*, n*) may be connected to and selectively (and individually) addressable via a corresponding bitline BL(n*) of the plurality of bitlines BL(n=1 to N), a corresponding wordline WL(m*) of the plurality of wordlines WL(m=1 to M), and a corresponding plateline PL(n*) of the plurality of platelines PL(n=1 to N). The *-notation may define one specific integer for the corresponding variable, such as a specific n* for the variable n, a specific m* for the variable m, etc.

In this exemplary configuration, each memory cell 102 (m*, n*) may be a three-terminal memory cell having a first terminal 104, a second terminal 106, and a third terminal 108. The first terminal 104 of a respective memory cell 102 (m*, n*) may be coupled to the corresponding plateline PL(n*). The second terminal 106 of the respective memory cell 102 (m*, n*) may be coupled to the corresponding bitline BL(n*). The third terminal 108 of the respective memory cell 102 (m*, n*) may be coupled to the corresponding wordline WL(m*).

The memory cell arrangement 100 may include a controller 200 (in some aspects referred to as control circuit). The controller 200 may be configured to apply a respective voltage to each control line described herein. The controller 200 may be configured to apply a plateline voltage, $V_{PL}$, (via the corresponding plateline PL(n*)) at the first terminal 104, a bitline voltage, $V_{BL}$, (via the corresponding bitline BL(n*)) at the second terminal 106, and a wordline voltage, $V_{WL}$, (via the corresponding wordline WL(m*)) at the third terminal 108 of the memory cell 102 (m*, n*) in order to address the memory cell 102 (m*, n*). The controller 200 may be configured to carry out a write operation to write a memory state of at least one memory cell 102 (m*, n*). The controller 200 (e.g., including a read-out circuit) may be configured to initiate (e.g., carry out) a read-out operation to read out the memory state of the at least one memory cell 102 (m*, n*).

"Writing" a memory cell, as used herein, may be understood as bringing the memory cell into one of at least two different memory states. Writing a memory cell may also be referred to as programming the memory cell, wherein the memory state the memory cell is residing in after programming may be called "programmed state". Therefore, the memory cell may also be referred to as state-programmable memory cell.

"Reading" a memory cell, as used herein, may be understood as determining the memory state the memory cell is residing in (e.g., programmed to). In general, a memory cell may be read either non-destructively (if the read-out operation does not change the memory state the memory cell is residing in) or destructively (if the read-out operation changes the memory state the memory cell is residing in). Thus, a destructive read-out operation may require a write operation subsequent to read-out in order to program again the memory state of the memory cell.

Figure 2:
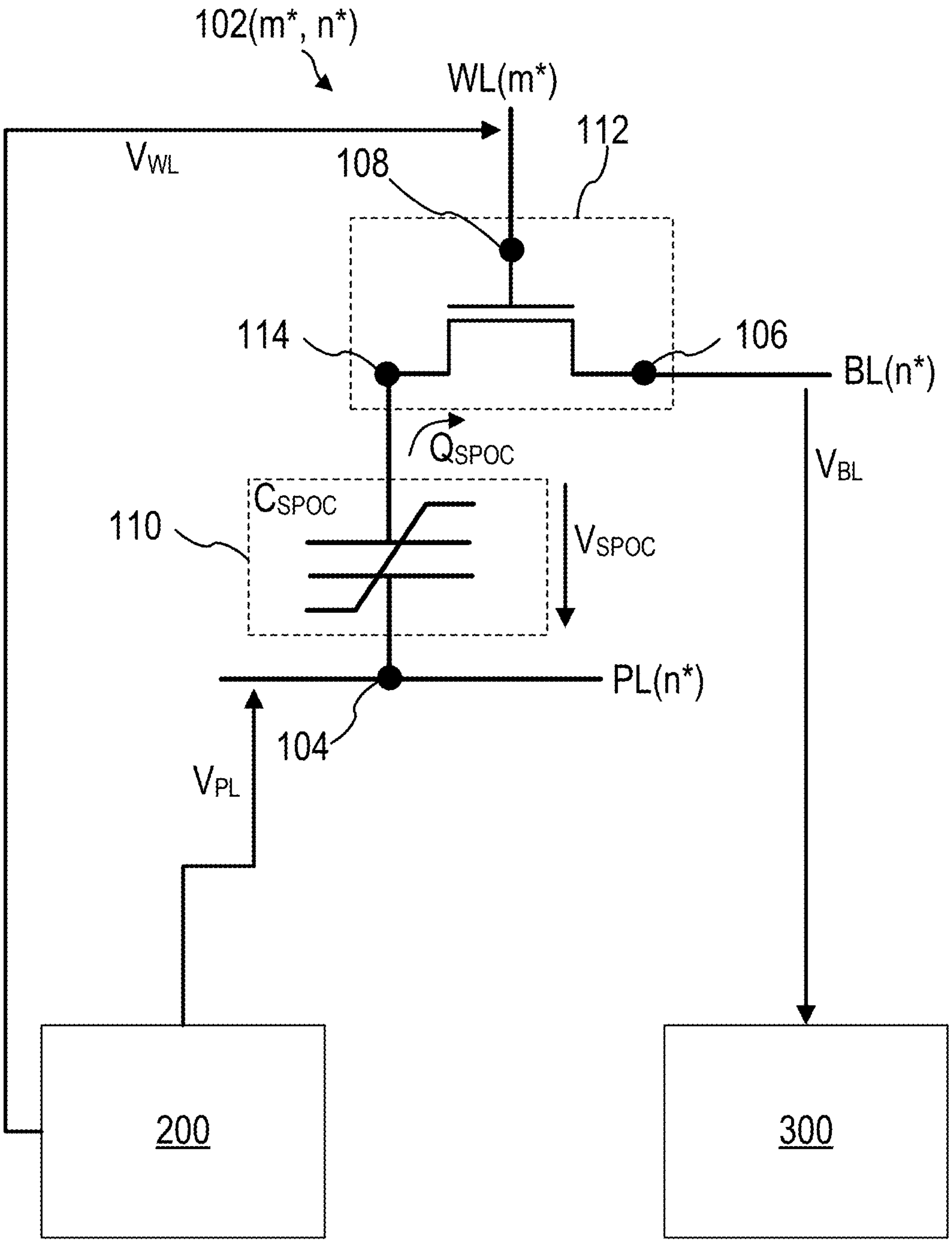
FIG. 2 shows an equivalent circuit of a memory cell that, during a read-out operation, is provided with a read voltage to develop a characteristic voltage at the bitline.

FIG. 2 shows an equivalent circuit of the memory cell 102 (m*, n*) according to various aspects. As detailed herein, the memory cell arrangement 100 serves as an exemplary memory cell arrangement; thus, the memory cell 102 (m*, n*) described herein may also be part of any other memory cell arrangement configured differently.

The memory cell 102 (m*, n*) may include the first terminal 104 coupled to the corresponding plateline PL(n*), the second terminal 106 coupled to the corresponding bitline BL(n*), and the third terminal 108 coupled to the corresponding wordline WL(m*).

The memory cell 102 (m*, n*) may include a capacitive memory structure, such as a spontaneously polarizable capacitor, SPOC, structure 110. Therefore, the memory cell 102 (m*, n*) may be referred to as capacitive memory cell or capacitor-type memory cell. The SPOC structure 110 may include a memory element disposed between at least two electrodes (e.g., two electrode layers).

The memory cell 102 (m*, n*) may include an access device. Herein, for illustration, the access device is described exemplarily as a field effect transistor (FET), such as a field-effect transistor (FET) structure 112 providing the (e.g., n-type or p-type) FET. It is understood that this serves for illustration and that the access device may be any other kind of access device.

The field-effect transistor, FET, structure 112 may include a gate structure, wherein the gate structure may include a gate isolation and a gate electrode. The gate structure may be a planar gate stack or may have another field-effect transistor designs with a non-planar shape, for example a trench gate transistor design, a vertical field-effect transistor design, or other designs, such as a fin-FET design. The gate electrode may be connected to the third terminal 108. Therefore, the third terminal 108 may also be referred to as gate terminal. The FET structure 112 may include a first source/drain terminal and a second source/drain terminal. The second source/drain terminal may be connected to the second terminal 106 of the memory cell 102 (m*, n*). A first electrode of the SPOC structure 110 may be coupled to the first terminal 104 and a second electrode of the SPOC structure 110 may be connected to the first source/drain terminal of the FET structure 112. The node coupled between the FET structure 112 and the SPOC structure 110 may be referred to as storage node (SN) 114 or storage terminal.

As detailed herein, the exemplarily described memory cell 102 (m*, n*) may include at least one capacitor (the SPOC structure 110) and a transistor (the FET structure 112) such that the memory cell 102 (m*, n*) may be a one transistor, T, one capacitor, C, memory cell (1T1C cell). It is understood that this serves for illustration and that the memory cell 102 (m*, n*) may include more than one capacitor, thus being a one transistor multiple capacitors memory cell (1TxC cell).

The memory state of the memory cell may be associated with a polarization state of the SPOC structure 110 (e.g., its memory element). The polarization state of the SPOC 110 may determine the amount of charge stored therein. The amount of charge stored in the SPOC structure 110 may be used to define the memory state of the memory cell. Thus, writing the memory cell may be associated with applying an electric field over the SPOC structure 110 to thereby set (e.g., change) the (e.g., remanent) polarization state of the SPOC structure 110.

The memory element may include or may consist of a spontaneously polarizable material. For example, the spontaneously polarizable material may be a remanent polarizable material, such as a ferroelectric material, or a non-remanent polarizable material, such as an anti-ferroelectric material. A memory element including or consisting of a spontaneously polarizable material may be understood such that the memory element has (e.g., within the framework of the SPOC structure 110) spontaneously polarizable properties. The SPOC structure 110 may provide a spontaneously polarizable capacitor (in some aspects also referred to as memory capacitor).

The spontaneously-polarizable memory element may show a hysteresis in the (voltage (drop) dependent) polarization. The spontaneously-polarizable memory element may show non-remanent spontaneous polarization (e.g., may show anti-ferroelectric properties), e.g., the spontaneously-polarizable memory element may have no or no substantial remanent polarization remaining in the case that no voltage drops over the spontaneously-polarizable memory element. In other aspects, the spontaneously-polarizable memory element may show remanent spontaneous polarization (e.g., may show ferroelectric properties), e.g., the spontaneously-polarizable memory element may have a remanent polarization or a substantial remanent polarization remaining in the case that no voltage drops over the spontaneously-polarizable memory element.

The terms "spontaneously polarized" or "spontaneous polarization" may be used herein, for example, with reference to the polarization capability of a material beyond dielectric polarization. A "spontaneously-polarizable" (or "spontaneous-polarizable") material may be or may include a spontaneously-polarizable material that shows a remanence, e.g., a ferroelectric material, and/or a spontaneously-polarizable material that shows no remanence, e.g., an anti-ferroelectric material. The coercivity of the spontaneously-polarizable material may be a measure of the strength of the reverse polarizing electric field that may be required to remove a remanent polarization.

A spontaneous polarization (e.g., a remanent or non-remanent spontaneous polarization) may be evaluated via analyzing one or more hysteresis measurements (e.g., hysteresis curves), e.g., in a plot of polarization, P, versus electric field, E, in which the material is polarized into opposite directions. The polarization capability of a material (dielectric polarization, spontaneous polarization, and a remanence characteristics of the polarization) may be analyzed using capacity spectroscopy, e.g., via a static (C-V) and/or time-resolved measurement or by polarization-voltage (P-V) or positive-up-negative-down (PUND) measurements. Another method for determining a polarization capability of a state-programmable memory element may include transmission electron microscopy, e.g., an electric-field dependent transmission electron microscopy.

The memory state may be understood as referring to a remanent polarization state that is set by applying a particular voltage across the SPOC structure 110 that is sufficient to set a corresponding polarization state, where, once set, the remanent polarization state is retained by the SPOC structure 110 even when the voltage across the SPOC structure 110 has been removed (e.g., it is remanently-polarizable). Once such a capacitive structure has been state-programmed to a remanent state, it generally retains the programmed state until it is re-programmed by applying a voltage across it that is sufficient to program the element to a (e.g., new) remanent state. As detailed herein, in a usual capacitive memory cell, the amount of charge stored in the capacitor structure may be used to define a memory state (e.g., a first amount of charge stored in the capacitor structure may define a first memory state and a second amount of charge stored in the capacitor structure and different from the first amount of charge may define a second memory state). As used herein, a (memory) state of a memory cell is described as "remanent" where the SPOC structure 110 is capable of retaining its programmed state even when it is not connected to a power source. As also used throughout, the current remanent state to which the memory element has been set may be referred to as the "stored" state, the "written" state, or the "programmed" state.

According to various aspects, in various types of applications, e.g., in memory technology, a remanent polarization as low as 0 $\mu C/cm^2$ to 3 $\mu C/cm^2$ may be regarded as no substantial remanent polarization. Such low values of a remanent polarization may be present in a layer or material due to undesired effects, e.g., due to a not ideal layer formation. According to various aspects, in various types of applications, e.g., in memory technology, a remanent polarization greater than 3 $\mu C/cm^2$ may be regarded as substantial remanent polarization. Such a substantial remanent polarization may allow for storing information as a function of a polarization state of a spontaneously polarizable layer or a spontaneously polarizable material.

In general, a remanent polarization (also referred to as retentivity or remanence) may be present in a material layer in the case that the material layer may remain polarized upon reduction of an applied electric field (E) to zero, therefore, a certain value for the electrical polarization (P) of the material layer may be detected. Illustratively, a polarization remaining in a material when the electric field is reduced to zero may be referred to as remanent polarization. Therefore, the remanence of a material may be a measure of the residual polarization in the material in the case that an applied electric field is removed. In general, ferroelectricity and anti-ferroelectricity may be concepts to describe a spontaneous polarization of a material similar to ferromagnetism and anti-ferromagnetism used to describe remanent magnetization in magnetic materials. According to various aspects, an electric coercive field, $E_C$, (also referred to as coercive field) may be or may represent the electric field required to depolarize a remanent-polarizable layer. In some aspects, the memory element may be remanent-polarizable, thereby providing the remanent polarization capability of the SPOC structure 110. In other aspects, the memory element may consist of a material that is spontaneously polarizable but shows no remanence (e.g., an anti-ferroelectric material) and additional conditions are implemented to generate an internal electric-field within the anti-ferroelectric material to thereby provide the remanent polarization capability of the SPOC structure 110. Hence, a non-remanently polarizable material, such as an anti-ferroelectric ("antiferroelectric") material may exhibit remanent polarizable properties within certain structures. An internal electric-field within an anti-ferroelectric material may be caused (e.g., applied, generated, maintained, as examples) by various strategies: e.g., by implementing floating nodes that may be charged to voltages different from zero volts, and/or by implementing charge storage layers, and/or by using doped layers, and/or by using electrode layers that adapt electronic work-functions to generate an internal electric field, by using an encapsulation structure which introduces compressive stress or tensile stress onto the memory element, thereby establishing the spontaneously polarizable properties, only as examples.

Figure 3:
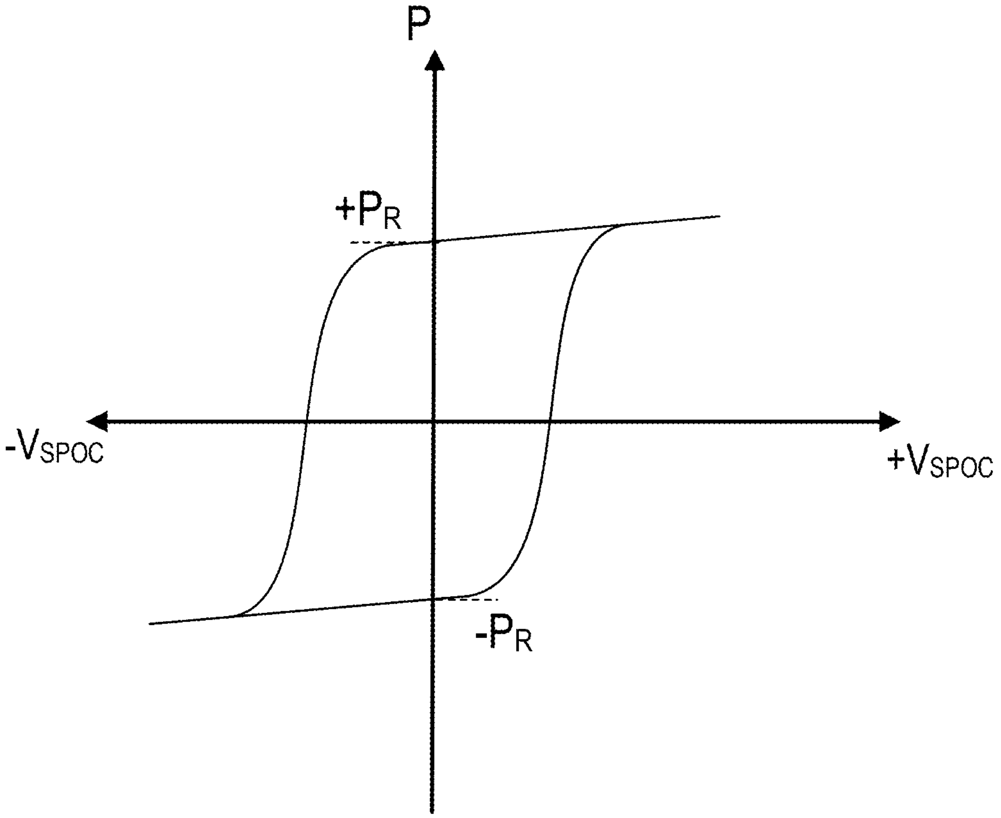
FIG. 3 shows an example of a typical hysteresis curve of a remanent-polarizable memory structure that plots the polarization as a function of the voltage across it.

FIG. 3 shows a typical hysteresis curve of a remanent-polarizable memory cell, where the polarization, P, is plotted as a function of the voltage, $V_{SPOC}$, across the SPOC structure 110. The voltage, $V_{SPOC}$, across the SPOC structure 110 may be a voltage difference between a voltage applied at the first terminal 104 (i.e., the plateline voltage $V_{PL}$) and a voltage applied at the storage node 114 and. FIG. 3 shows the (capacitive) memory cell 102 (m*, n*) exemplarily as a remanent-polarizable memory cell to illustrate various aspects thereof. The graph shows two remanent polarization states ($+P_R$, $-P_R$) of the memory element that may represent the programmable states of the memory element. For example, the memory cell 102 (m*, n*) may be programmed to remanent polarization state $+P_R$ (representing, for example, a bit of digital information with a value of "0") or to remanent polarization state $-P_R$ (representing, for example, a bit of digital information with a value of "1"), or vice versa, by applying a programming voltage across the SPOC structure 110 that is sufficient to program the corresponding remanent polarization state (e.g., via applying a plateline voltage $V_{PL}$ and a bitline voltage $V_{BL}$).

To read the stored memory state of the SPOC structure 110, a read voltage is typically applied across the SPOC structure 110 that is sufficient to program a remanent state of the state-programmable memory element to a predefined state. This develops a charge, $Q_{SPOC}$, that depends on the programmed state before the read voltage was applied, where if the read-out operation caused the state-programmable memory element to switch to a new state (e.g., the predefined state is different from the previously programmed state), a larger charge (resulting from a dielectric charge of the memory element and a switching charge (also referred to as polarization charge) due to switching the memory (polarization) state) will be provided, whereas if the read operation caused the state-programmable memory element to be reprogrammed to the same state (e.g., the predefined state is the same as the previously programmed state), little charge (resulting from a dielectric charge of the memory element) will be provided from the memory element.

Figure 4:
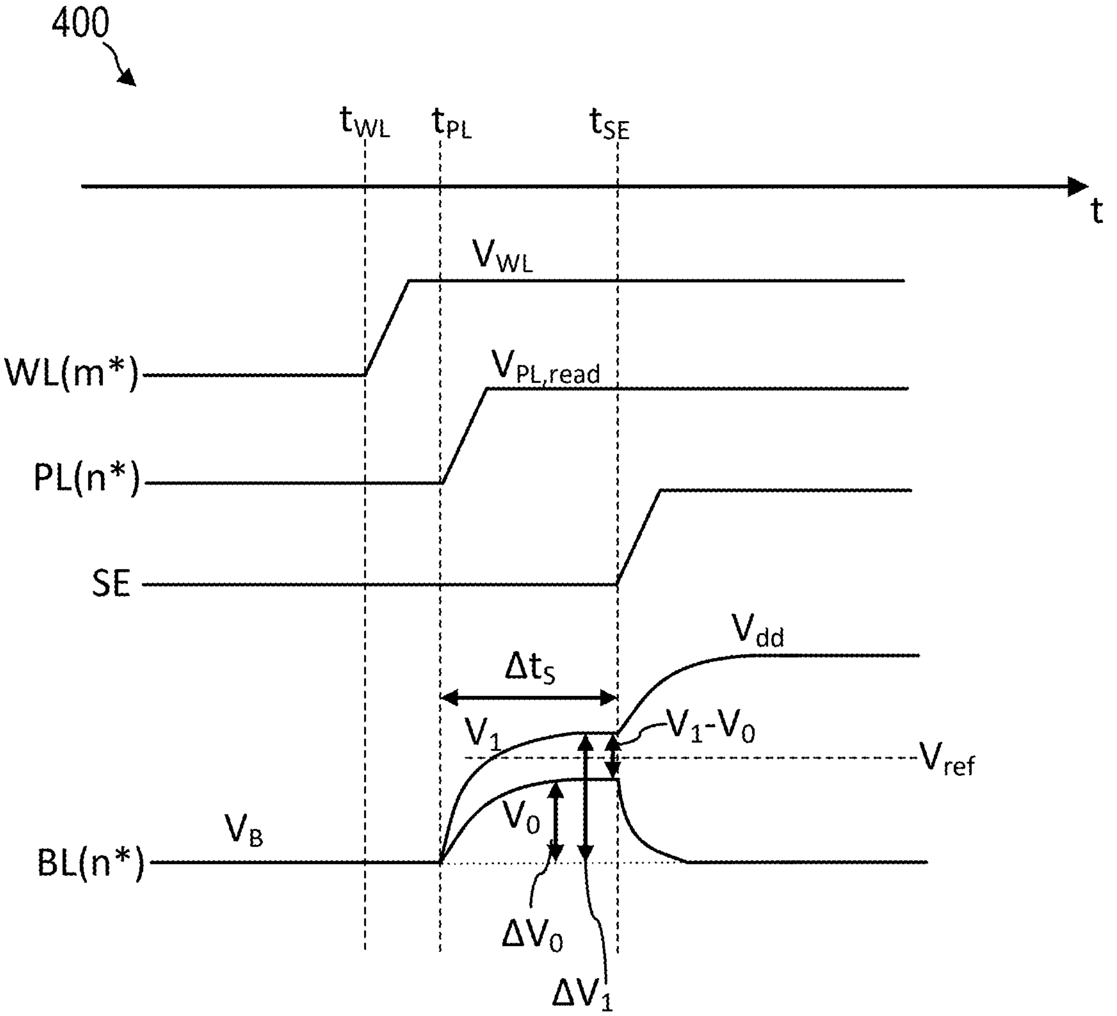
FIG. 4 shows a typical timing diagram of a read-out operation for determining a memory state of the memory cell.

In the following, an exemplary read-out operation for reading the memory state of the memory cell 102 (m*, n*) is detailed with reference to FIG. 2 and FIG. 4 which shows a typical timing diagram 400 of a read-out operation.

During a read-out operation, the corresponding bitline BL(n*) may be first discharged to the base voltage, $V_B$, (e.g., ground, GND). Then, a wordline voltage, $V_{WL}$, may be applied (at a wordline charging time step $t_{WL}$) to the corresponding wordline WL(m*) to activate (e.g., open) the access device (such as the FET structure 112). Once, a plateline voltage, $V_{PL}$, (e.g., the read plateline voltage, $V_{PL,\ read}$) is applied (at a plateline charging time step $t_{PL}$) to the corresponding plateline PL(n*), the charge ($Q_{SPOC}$) is provided to corresponding BL(n*) that depends on the (programmed) memory state of the SPOC structure 110 and its dielectric capacitance. Due to this, a characteristic voltage is developed onto the corresponding BL(n*). With reference to FIG. 4, a first voltage $V_1$ may develop onto the corresponding BL(n*) in the case that the memory cell 102 (m*, n*) stores a logic "1" (also referred to as "1" bit) as memory state and a second voltage $V_0$ may develop onto the corresponding BL(n*) in the case that the memory cell 102 (m*, n*) stores a logic "0" (also referred to as "0" bit) as memory state. The time until fully charging the corresponding BL(n*) may be referred to as signal development time, $\Delta t_s$. The difference between the first voltage $V_1$ and the second voltage $V_0$ may define the read window ($V_1-V_0$).

It is understood that there may also be a charging of the corresponding bitline BL(n*) due to a capacitive ratio between a dielectric capacitance that is intrinsic to the memory cell and a capacitance of the node to which it is connected, such as the corresponding bitline BL(n*). As a result, the (bitline) voltage to which the corresponding bitline BL(n*) is charged to during a read-out operation (short: read operation) may depend not only on the switching charge but also on the capacitive ratio. This is why when the memory state is not switched during the read-out operation (e.g., the read state is the same as the predefined state, e.g., a logic "0"), a voltage is still provided. For example, if a memory cell is configured to provide a dielectric charge to the corresponding bitline BL(n*) by applying the plateline voltage, $V_{PL}$, when the memory element does not flip states (e.g., reading a "0" when the predefined state is also a logic "0") and delivers little to no charge to the corresponding bitline BL(n*), the voltage on the bitline will be $V_{PL}*C_{dielectric}/(C_{dielectric}+C_{BL})$, where $C_{dielectric}$ is the dielectric capacitance of the memory element and is the $C_{BL}$ capacitance of the corresponding bitline BL(n*).

With reference to FIG. 2, the controller 200 may be configured to apply, during the read-out operation, the plateline voltage, $V_{PL}$, and the wordline voltage, $V_{WL}$. The corresponding bitline BL(n*) may be connected to a sensing circuit 300. According to various aspects, the memory cells that share a common bitline BL(n) may be connected to a same sensing circuit 300. Thus, the memory cell arrangement 100 may include one or more sensing circuits 300. In some aspects, the controller 200 may include the one or more sensing circuits. In the read-out operation, the sensing circuit 300 may be configured to sense the voltage developed at the bitline (i.e., the bitline voltage $V_{BL}$) and compare the sensed voltage with a predefined reference voltage, $V_{ref}$ (see, for example, FIG. 4). Thus, if the developed bitline voltage, $V_{BL}$, is greater than the predefined reference voltage, $V_{ref}$, (in the case of $V_1$) the memory state is determined as a "1" and if the developed bitline voltage, $V_{BL}$, is less than the predefined reference voltage, $V_{ref}$, (in the case of $V_0$) the memory state is determined as "0". Therefore, the reference voltage, $V_{ref}$, may also be referred to as threshold voltage. The sensing circuit 300 may, for example, be or include a sense amplifier. The sense amplifier may discharge the corresponding bitline BL(n*) to the base voltage, $V_B$, in the case that the memory state is a logic "0" and may charge the corresponding bitline BL(n*) to the positive supply voltage, $V_{dd}$, in the case that the memory state is a logic "1". To write the memory cell 102 (m*, n*) into a logic "1" (as memory state), the positive supply voltage, $V_{dd}$, may be applied at the corresponding bitline BL(n*) and about 0 V may be applied at the corresponding plateline PL(n*). To write the memory cell 102 (m*, n*) into a logic "0" (as memory state), the positive supply voltage, $V_{dd}$, may be applied at the corresponding plateline PL(n*) and about 0 V may be applied at the corresponding bitline BL(n*).

As understood, a single sense amplifier may be connected to multiple memory cells that are part of a same group and therefore share a common bitline BL(n*).

Figure 5:
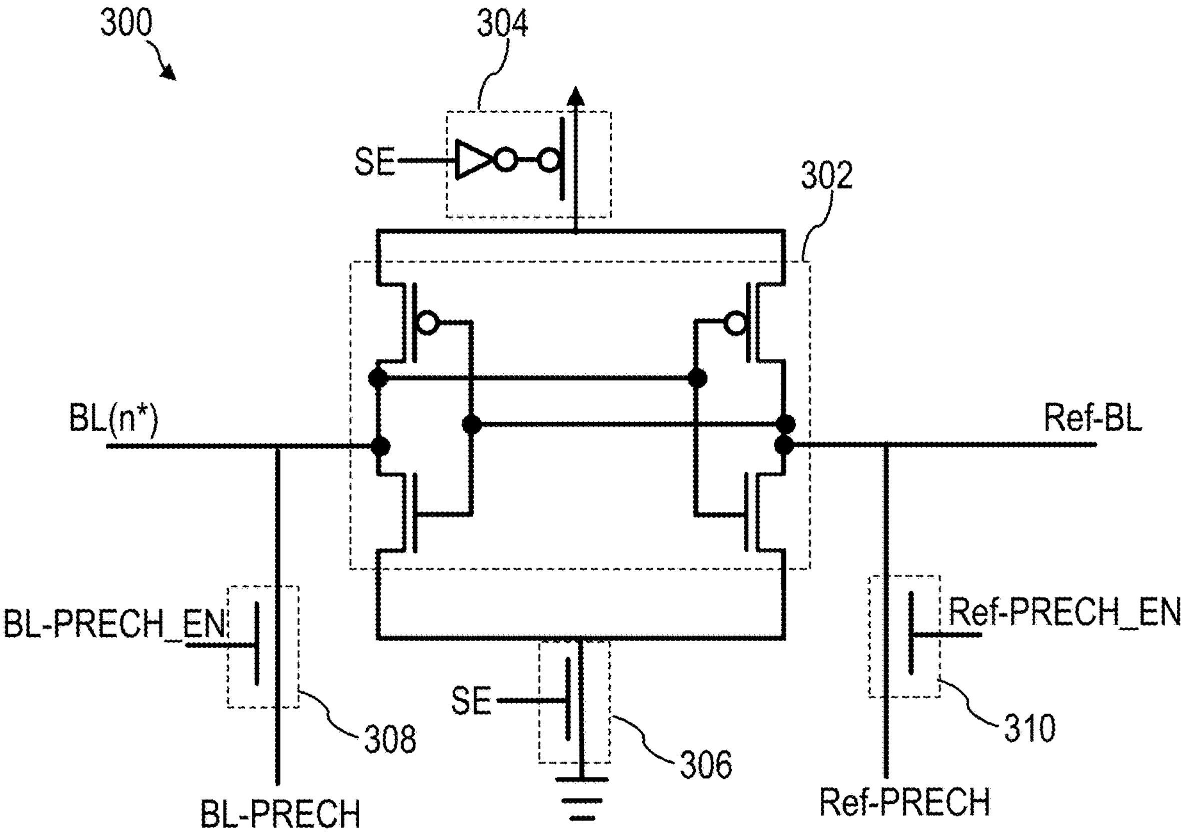
FIG. 5 shows an exemplary configuration of a sense amplifier according to various aspects.

FIG. 5 shows an exemplary configuration of a sense amplifier 300 according to various aspects. The sense amplifier 300 may be differential or dual-sided, where one side of the sense amplifier 300 is connected to one bitline (such as the corresponding bitline BL(n*) of one array of memory cells and the other side of the sense amplifier 300 is connected to another bitline (such as a reference bitline, Ref-BL) of a different array of memory cells. In a dual-sided configuration, one side of the sense amplifier 300 may be actively operated to read a bitline (such as the corresponding bitline BL(n*) in the present example) of one set of cells while the other side (its complement) of the sense amplifier acts as a reference (such as the reference bitline, Ref-BL, in the present example), and vice versa. In a dual-sided sense amplifier configuration, each sense amplifier may be understood as a latch 302 whose two inputs are the two bitlines, where the latch is enabled by a sense enable (SE) signal (e.g., provided at a sense enable time step $t_{SE}$). The latch 302 may be connected via one or more sense enable transistors/switches 304, 306 that, when enabled, connects one side (the corresponding bitline BL(n*) in the present example) of its supply to a supply power and the other side (the reference bitline, Ref-BL, in the present example) of its supply to the base voltage (e.g., ground). The enable transistors/switches 304, 306 may be operated by the sense enable (SE) signal to supply power to the latch 302 when the SE signal is enabled and to leave the supply floating when the SE signal is not enabled. The side of the latch 302 may be selected by pre-charging transistors/switches 308, 310 which may be operated by corresponding (enable) signals (BL-PRECH_EN, Ref-PRECH_EN) that, when enabled, connect the corresponding bitline to its corresponding source voltage (BL-PRECH, REF-PRECH) for charging/discharging the corresponding bitline.

As detailed herein, in a memory cell arrangement, such as the memory cell arrangement 100, a plurality of memory cells may be coupled to a common plateline and a common bitline. Hence, other memory cells 102 (m=1 to M/*, n*) may also be connected to the corresponding plateline PL(n*) and to the corresponding bitline BL(n*) of the memory cell 102 (m*, n*). Although those other memory cells 102 (m=1 to M/*, n*) may not be selected (i.e., no wordline voltage $V_{WL}$ may be applied at their corresponding wordlines to open their FET structures 112; it is understood that an inhibit voltage may be applied to those other wordlines), there may be a coupling between those other memory cells 102 (m=1 to M/*, n*) and the corresponding bitline BL(n*) of the selected memory cell 102 (m*, n*).

Figure 6A:
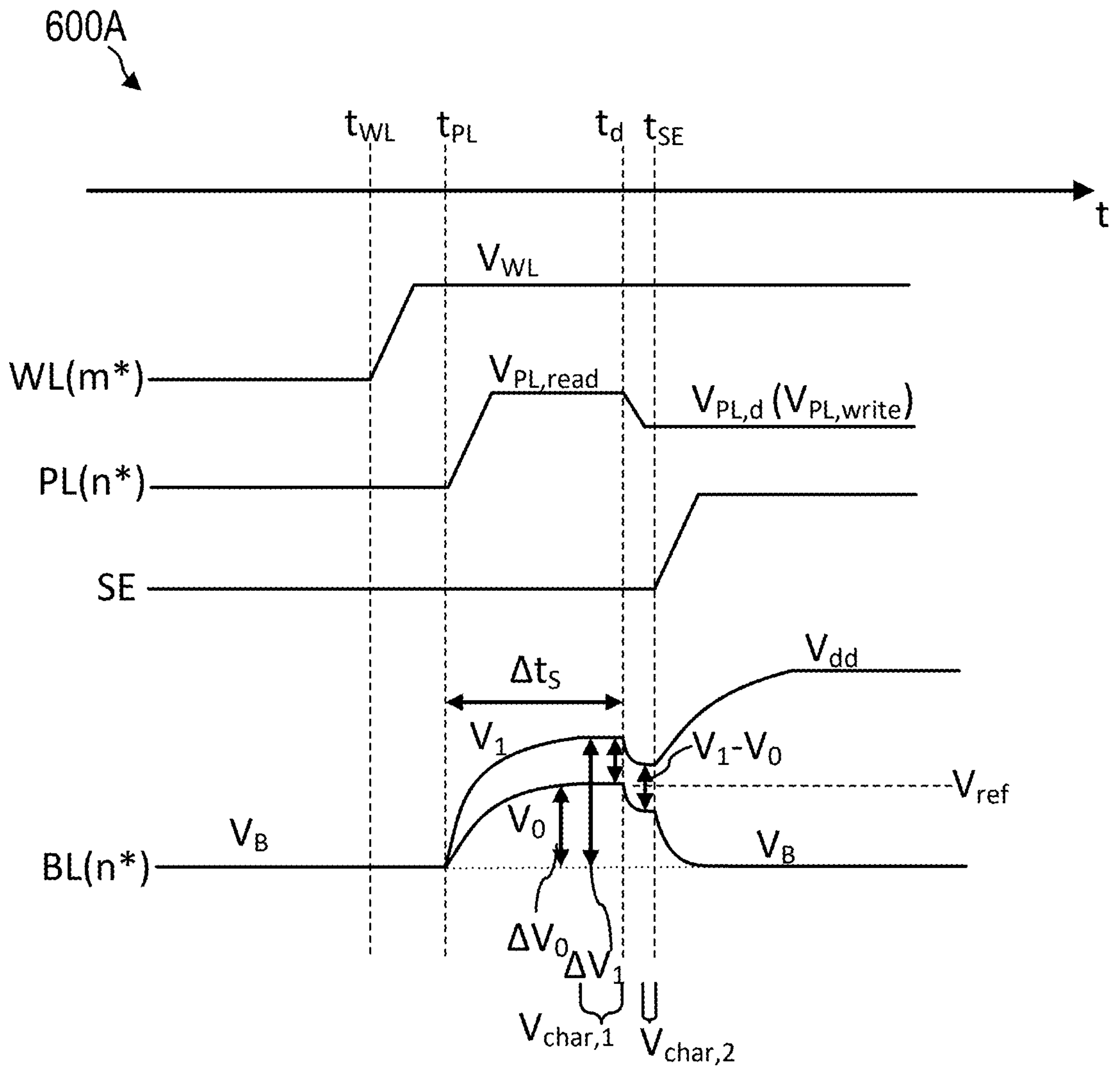
FIG. 6A to FIG. 6C each show a timing diagram of a read-out operation for determining a memory state of the memory cell according to various aspects.
Figure 6B:
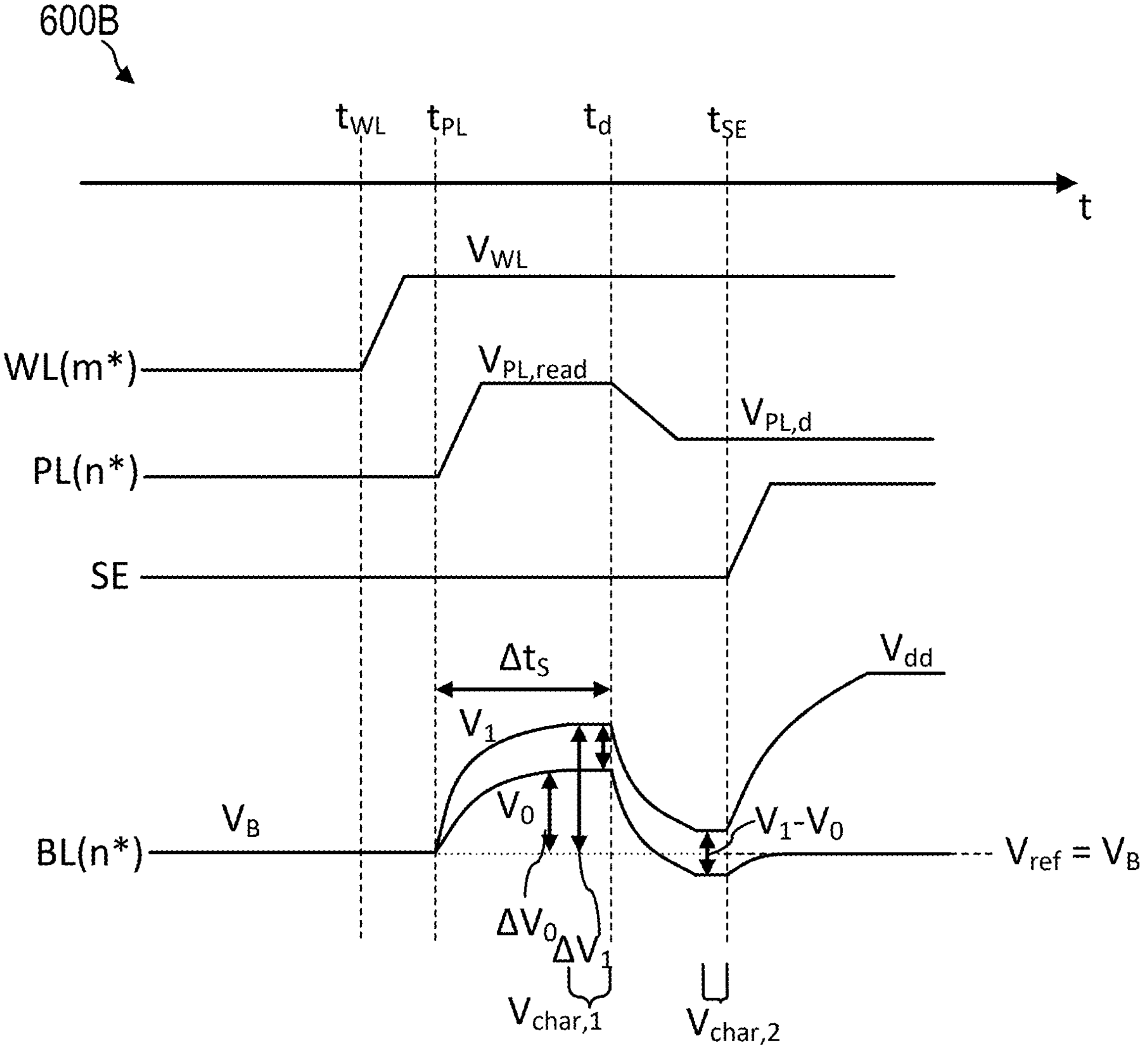
Figure 6C:
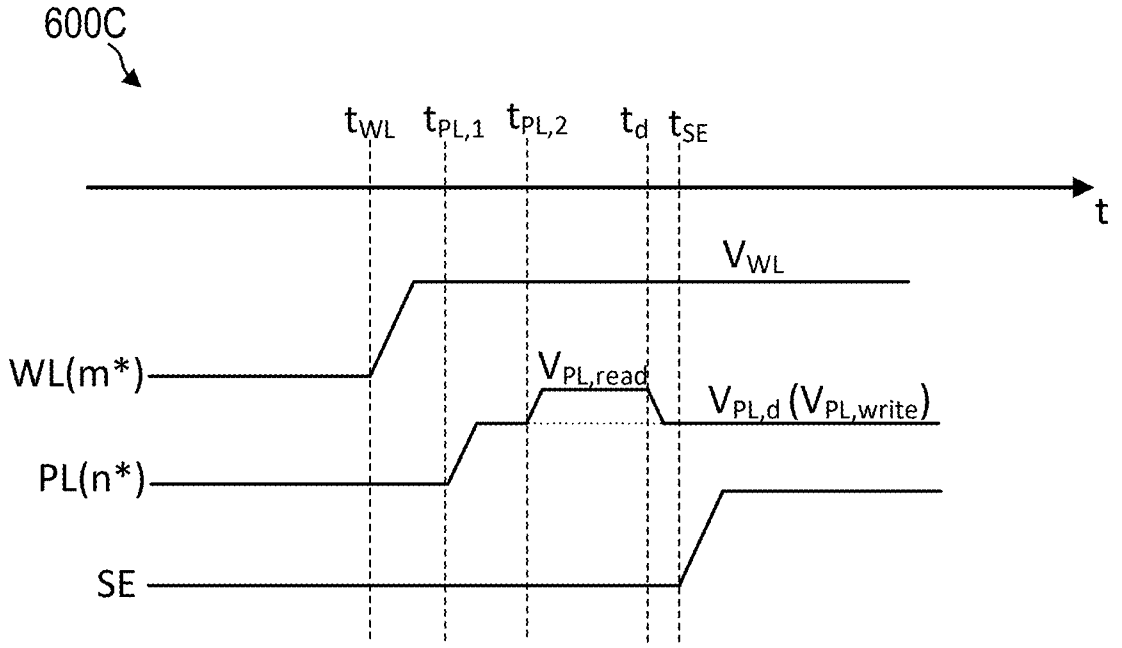

FIG. 6A to FIG. 6C each show a respective timing diagram 600A, 600B, 600C of a read-out operation according to various aspects.

As detailed with reference to FIG. 4, the corresponding bitline BL(n*) may be charged to the characteristic voltage $V_{char}=V_1$ (in the case that the memory element stores a logic "1" as memory state) or $V_{char}=V_0$ (in the case that the memory element stores a logic "0" as memory state) responsive to by applying the plateline read voltage $V_{PL,read}$ (having a first plateline read voltage value) at the corresponding plateline PL(n*) and by applying the wordline voltage $V_{WL}$ at the corresponding wordline WL(m*).

According to various aspects, with reference to the timing diagram 600A of FIG. 6A, the corresponding plateline PL(n*) is then discharged from the plateline read voltage $V_{PL,read}$ to the plateline discharge voltage $V_{PL,d}$ (having a second plateline read voltage value) at the plateline discharge time step $t_d$ (by decreasing the plateline voltage from the first plateline read voltage value of the plateline read voltage $V_{PL, read}$ to the second plateline read voltage value of the plateline discharge voltage $V_{PL, d}$). The discharging of the corresponding plateline PL(n*) results in a discharging of the corresponding bitline BL(n*). The amount the corresponding bitline BL(n*) is discharged is substantially the same in both cases of the characteristic voltage $V_{char}$ (i.e., for $V_0$ and $V_0$). Thus, the read window ($V_1-V_0$) keeps the same. Thus, the corresponding bitline BL(n*) may be discharged from a first characteristic voltage $V_{char,1}$ ($\Delta V_0$ or $\Delta V_1$) prior to the plateline discharge time step $t_d$ to second characteristic voltage $V_{char,2}$ after the plateline discharge time step $t_d$.

At the sense enable time step $t_{SE}$ the sense amplifier 300 (e.g., its latch) may be enable to sense the second characteristic voltage $V_{char,2}$ and to determine the memory state of the memory cell 102 (m*, n*) based on the second characteristic voltage $V_{char,2}$. The sense amplifier 300 may then amplify the bitline voltage $V_{BL}$ to the positive supply voltage $V_{dd}$ in the case that the memory state is a logic "1" or may discharge the corresponding bitline BL(n*) to the base voltage, $V_B$, in the case that the memory state is a logic "0". Since the corresponding plateline PL(n*) is discharged to the plateline discharge voltage $V_{PL,d}$ prior to the plateline discharge time step $t_d$, the effective voltage $V_{SPOC}$ over the memory element is at no time equal to the plateline read voltage $V_{PL,read}$ (i.e., $V_{SPOC}=V_{read}-V_B=V_{read}$), but the maximum effective voltage $V_{SPOC}$ over the memory element is the plateline discharge voltage (i.e., $V_{SPOC}=V_d-V_B=V_d$). Thus, the stress on the memory cells that store a logic "0" as memory state (e.g., the stress on an oxide of the memory capacitor) can be reduced significantly. Besides reducing the maximum effective voltage $V_{SPOC}$ over the memory element, also the time duration for which the (high) plateline read voltage $V_{PL,read}$ is applied is reduced, thereby further reducing the stress on the memory element. For example, a time duration of the signal development time, $\Delta t_s$, may be equal to or less than about 10 ns, whereas a time duration for which the sense amplifier 300 is turned on and sensing biasing conditions are applied may be in a range of microseconds (e.g., about 80 μs). For illustration, when comparing the sensing process to the one of DRAM, the activate to precharge timing is about nine times the maximum average periodic refresh, $t_{REFI}$, resulting in a time duration, for which the sensing biasing conditions are applied, of about 70 μs. When taking a same stress over the memory element into account, the above detailed read-out operation allows for a greater read voltage without increasing a reliability of the memory cell.

According to various aspects, a voltage value of the plateline discharge voltage $V_{PL,d}$ may correspond to a voltage value of the plateline write voltage $V_{PL,write}$. This allows to use the power which is already provided for providing the plateline write voltage $V_{PL,write}$ also for discharging the corresponding plateline PL(n*) during the read-out operation (i.e., during reading); thus, $V_{PL,d}=V_{PL,write}$.

According to various aspects, with reference to the timing diagram 600B of FIG. 6B, the plateline discharge voltage $V_{PL,d}$ may be such that the second characteristic voltage $V_{char,2}$ (i.e., the voltage the corresponding bitline BL(n*) is discharged to) is less than the base voltage, $V_B$, (i.e., having a negative sign) in the case that the memory cell stores a logic "0" (i.e., for $V_0$) and is greater than the base voltage, $V_B$, (i.e., having a positive sign) in the case that the memory cell stores a logic "1" (i.e., for $V_1$). This allows to use the base voltage, $V_B$, as the predefined reference voltage, $V_{ref}$. With this, a total number of power supplies may also stay the same since although requiring an additional power supply for supplying the plateline discharge voltage $V_{PL,d}$, the power supply for supplying the predefined reference voltage $V_{ref}$ is not required any more. Using the base voltage, $V_B$, as the predefined reference voltage, $V_{ref}$, allows to increase the robustness (e.g., accuracy) of the read-out operation since the base voltage, $V_B$, is less susceptible to errors. For example, the power supply for supplying the predefined reference voltage $V_{ref}$ has a critical impact on the read-out operation since its variability affects the read window (in some aspects referred to as memory window).

According to various aspects, with reference to the timing diagram 600C of FIG. 6C, the plateline voltage $V_{PL}$ may be increased to the plateline read voltage $V_{PL,read}$ stepwise (e.g., in the timing diagram 600A or the timing diagram 600B). For example, at a first plateline charging time step $t_{PL,1}$ the corresponding plateline PL(n*) may be charged to the plateline discharge voltage $V_{PL,d}$, and subsequently the corresponding plateline PL(n*) may be charged from the plateline discharge voltage $V_{PL,d}$ to the plateline read voltage $V_{PL,read}$ at a second plateline charging time step $t_{PL,2}$. With this, a maximum current provided (e.g., delivered) to the corresponding plateline PL(n*) is reduced, thereby reducing the noise caused by the voltage toggling of the corresponding plateline PL(n*) (being a large node). Thus, a maximum value of a current spike resulting from charging the corresponding plateline PL(n*) is reduced. Illustratively, this allows for a controlled way of charging the corresponding plateline PL(n*).

Figure 7:
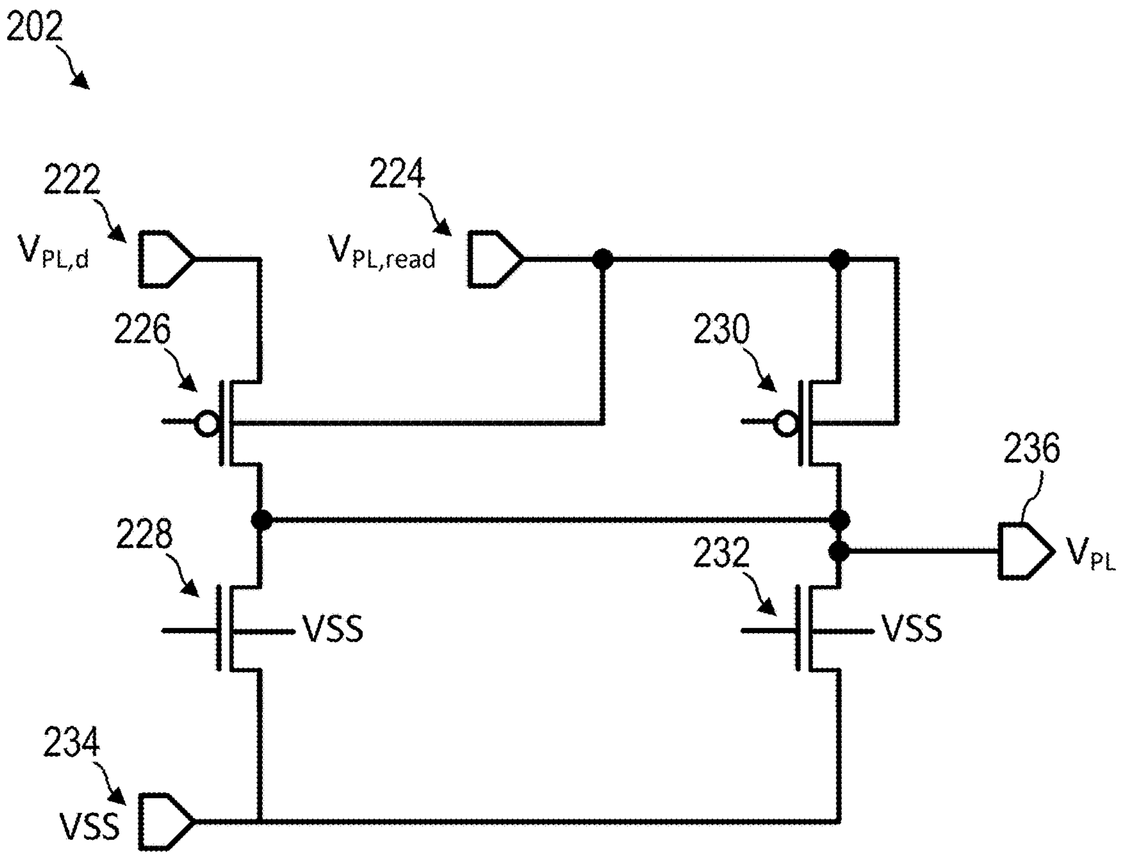
FIG. 7 shows an exemplary plateline driver for providing two different plateline voltages during reading a memory cell according to various aspects.

The controller 200 may include a plateline driver configured to provide the plateline voltage, $V_{PL}$, to the corresponding plateline PL(n*). FIG. 7 shows an exemplary plateline driver 202 for providing the plateline read voltage, $V_{PL,read}$, (in some aspects referred to as first plateline read voltage) and the plateline discharge voltage $V_{PL,d}$, (in some aspects referred to as second plateline read voltage) during the read-out operation.

The plateline driver 202 may be connected to a (third) power supply 234 configured to supply the negative supply voltage VSS (or $V_{SS}$).

The plateline driver 202 may be connected to a first power supply 222 configured to supply the plateline read voltage, $V_{PL,read}$ and a second power supply 224 configured to supply the plateline discharge voltage $V_{PL,d}$. Illustratively, the plateline driver 202 may allow to switch from providing the plateline read voltage, $V_{PL,read}$ to providing the plateline discharge voltage $V_{PL,d}$ as plateline voltage $V_{PL}$ at the corresponding plateline PL(m*) 236. As detailed herein, in some aspects the plateline discharge voltage $V_{PL,d}$ may correspond to the plateline write voltage, $V_{PL,write}$. In the case that the base voltage $V_B$ is used as reference voltage, the plateline discharge voltage $V_{PL,d}$ may be different from the plateline write voltage, $V_{PL,write}$. In this case, the plateline driver 202 may include a further (fourth) power supply configured to supply the plateline write voltage, $V_{PL,write}$.

The plateline driver 202 may include a first pull-up transistor 226, a first pull-down transistor 228, a second pull-up transistor 230, and a second pull-down transistor 232.

The plateline driver 202 may also be configured in a manner to define the slope with which the corresponding plateline PL(m*) 236 is discharged from the plateline read voltage, $V_{PL,read}$ to the plateline discharge voltage $V_{PL,d}$ (or vice versa in the case of stepwise charging detailed with reference to the timing diagram 600C). For example, the second pull-down transistor 232 may allow for a greater current flow than the first pull-down transistor 228, therefore allowing for a faster discharging than the first pull-down transistor 228.

It is understood that the plateline driver 202 serves as an example for implementing the read-out operation disclosed herein (e.g., according to any of the timing diagrams 600A, 600B, 600C) and that the plateline driver may be configured differently.

FIG. 8 shows a flow diagram of a method 800 of reading a capacitive memory cell according to various aspects.

The method 800 may include (in 802) charging a bitline connected to the capacitive memory cell to a first characteristic voltage by applying a plateline voltage having a first plateline read voltage value at a plateline connected to the capacitive memory cell and by applying a wordline voltage at a wordline connected to the capacitive memory cell.

The method 800 may include (in 804) decreasing the plateline voltage from the first plateline read voltage value to a second plateline read voltage value to thereby discharge the bitline from the first characteristic voltage to a second characteristic voltage.

The method 800 may include (in 806) determining a memory state of the capacitive memory cell based on sensing the second characteristic voltage.

It may be intended that aspects described in relation to one or more of the methods may apply also to the memory cell arrangement, and vice versa. For example, a method may include an execution of one or more functions a component of the memory cell arrangement (e.g., the one or more write modification circuits) is configured to.

In the following, various examples are provided that may include one or more aspects described above with reference to the memory cell 102, the memory cell arrangement 100, and to the methods described herein. It may be intended that aspects described in relation to one or more of the methods may apply also to the memory cell and/or the memory cell arrangement, and vice versa.

Example 1 is a memory cell arrangement including: a plurality of bitlines; a plurality of wordlines; a plurality of platelines; a plurality of capacitive memory cells, wherein each capacitive memory cell of the plurality of capacitive memory cells is connected to and selectively addressable by a corresponding bitline of the plurality of bitlines, a corresponding wordline of the plurality of wordlines, and a corresponding plateline of the plurality of platelines; a control circuit configured to carry out a read-out operation to read out a memory state of a capacitive memory cell of the plurality of capacitive memory cells by addressing the capacitive memory cell via its corresponding bitline, corresponding wordline, and corresponding plateline, the read-out operation including: charging the corresponding bitline to a first characteristic voltage by applying a plateline voltage having a first plateline read voltage value at the corresponding plateline and by applying a wordline voltage at the corresponding wordline; decreasing the plateline voltage from the first plateline read voltage value to a second plateline read voltage value to thereby discharge the corresponding bitline from the first characteristic voltage to a second characteristic voltage; and determining the memory state of the capacitive memory cell based on sensing the second characteristic voltage.

In Example 2, the subject matter of Example 1 can optionally include that the control circuit includes a sense amplifier for sensing the characteristic voltage and determining the memory state based on the characteristic voltage.

In Example 3, the subject matter of Example 1 or 2 can optionally include that the read-out operation includes that the corresponding bitline is charged for a predefined signal development time interval and that the plateline voltage is decreased from the first plateline read voltage value to the second plateline read voltage value after the predefined signal development time interval.

In Example 4, the subject matter of any one of Examples 1 to 3 can optionally include that the read-out operation includes that plateline voltage is applied by charging the corresponding plateline to the second plateline read voltage value in a first plateline charging time interval and by charging the corresponding plateline from the second plateline read voltage value to the first plateline read voltage value in a second plateline charging time interval after the first plateline charging time interval.

In Example 5, the subject matter of any one of Examples 1 to 4 can optionally include that the control circuit is further configured to carry out a write operation to set a memory state of the capacitive memory cell by addressing the capacitive memory cell via its corresponding bitline, corresponding wordline, and corresponding plateline, wherein the write operation includes applying a plateline voltage having the second plateline read voltage value at the corresponding plateline.

In Example 6, the memory cell arrangement of any one of Examples 1 to 5 can optionally further include: a first power supply configured to supply the plateline voltage having the first plateline read voltage value; and a second power supply configured to supply the plateline voltage having the second plateline read voltage value.

In Example 7, the subject matter of any one of Examples 1 to 6 can optionally include that read-out operation includes that the memory state of the capacitive memory cell is determined by comparing the second characteristic voltage to a base (e.g., ground) voltage (as reference voltage).

In Example 8, the subject matter of Example 7 can optionally include that the base voltage is a ground voltage.

In Example 9, the subject matter of any one of Examples 1 to 8 can optionally include that each capacitive memory cell of the plurality of capacitive memory cells is a remanent-polarizable memory cell.

Example 10 is a memory cell arrangement including: a bitline, a wordline, and a plateline; a capacitive (state-programmable) memory cell connected to and addressable via the bitline, the wordline, and the plateline; a control circuit configured to carry out a read-out operation to read out a memory state of the capacitive memory cell, the read-out operation including: charging the bitline to a first characteristic voltage by applying a plateline voltage having a first plateline read voltage value at the plateline and by applying a wordline voltage at the corresponding wordline; decreasing the plateline voltage from the first plateline read voltage value to a second plateline read voltage value to thereby discharge the corresponding bitline from the first characteristic voltage to a second characteristic voltage; and determining the memory state of the capacitive memory cell based on sensing the second characteristic voltage.

In Example 11, the subject matter of Example 10 can optionally include that the control circuit includes a sense amplifier for sensing the characteristic voltage and determining the memory state based on the characteristic voltage.

In Example 12, the subject matter of Example 10 or 11 can optionally include that the read-out operation includes that the bitline is charged for a predefined signal development time interval and that the plateline voltage is decreased from the first plateline read voltage value to the second plateline read voltage value after the predefined signal development time interval.

In Example 13, the subject matter of any one of Examples 10 to 12 can optionally include that the read-out operation includes that plateline voltage is applied by charging the plateline to the second plateline read voltage value in a first plateline charging time interval and by charging the plateline from the second plateline read voltage value to the first plateline read voltage value in a second plateline charging time interval after the first plateline charging time interval.

In Example 14, the subject matter of any one of Examples 10 to 13 can optionally include that the control circuit is further configured to carry out a write operation to set a memory state of the capacitive memory cell by addressing the capacitive memory cell via its bitline, wordline, and plateline, wherein the write operation includes applying a plateline voltage having the second plateline read voltage value at the corresponding plateline.

In Example 15, the memory cell arrangement of any one of Examples 10 to 14 can optionally further include: a first power supply configured to supply the plateline voltage having the first plateline read voltage value; and a second power supply configured to supply the plateline voltage having the second plateline read voltage value.

In Example 16, the subject matter of any one of Examples 10 to 15 can optionally include that read-out operation includes that the memory state of the capacitive memory cell is determined by comparing the second characteristic voltage to a base (e.g., ground) voltage (as reference voltage).

In Example 17, the subject matter of Example 16 can optionally include that the base voltage is a ground voltage.

In Example 18, the subject matter of any one of Examples 10 to 17 can optionally include that the capacitive memory cell is a remanent-polarizable memory cell.

Example 19 is a method of reading a capacitive memory cell which is connected to a bitline, a plateline, and a wordline, the method including: charging the bitline to a first characteristic voltage by applying a plateline voltage having a first plateline read voltage value at the plateline and by applying a wordline voltage at the wordline; decreasing the plateline voltage from the first plateline read voltage value to a second plateline read voltage value to thereby discharge the bitline from the first characteristic voltage to a second characteristic voltage; and determining a memory state of the capacitive memory cell based on sensing the second characteristic voltage.

In Example 20, the subject matter of Example 19 can optionally include that the bitline is charged for a predefined signal development time interval and the plateline voltage is decreased from the first plateline read voltage value to the second plateline read voltage value after the predefined signal development time interval.

In Example 21, the subject matter of Example 19 or 20 can optionally include that the plateline voltage is applied by charging the plateline to the second plateline read voltage value in a first plateline charging time interval and by charging the plateline from the second plateline read voltage value to the first plateline read voltage value in a second plateline charging time interval after the first plateline charging time interval.

In Example 22, the method of any one of Examples 19 to 21 can optionally further include: writing the memory cell into a memory state by applying a plateline voltage having the second plateline read voltage value at the plateline.

In Example 23, the subject matter of any one of Examples 19 to 22 can optionally include that the memory state of the capacitive memory cell is determined by comparing the second characteristic voltage to a base (e.g., ground) voltage (as reference voltage).

In Example 24, the subject matter of Example 23 can optionally include that the base voltage is a ground voltage.

In Example 25, the subject matter of any one of Examples 19 to 24 can optionally include that the capacitive memory cell is a remanent-polarizable memory cell.

The term "connected" may be used herein with respect to nodes, terminals, integrated circuit elements, and the like, to mean electrically connected, which may include a direct connection or an indirect connection, wherein an indirect connection may only include additional structures in the current path that do not influence the substantial functioning of the described circuit or device. The term "electrically conductively connected" that is used herein to describe an electrical connection between one or more terminals, nodes, regions, contacts, etc., may be understood as an electrically conductive connection with, for example, ohmic behavior, e.g., provided by a metal or degenerate semiconductor in absence of p-n junctions in the current path. The term "electrically conductively connected" may be also referred to as "galvanically connected".

The term "coupled to" used herein with reference to functional parts of a memory cell (e.g., functional parts of a memory structure) that are coupled to respective nodes (e.g., plateline node, bitline node, and/or wordline node) of the memory cell may be understood as follows: the respective functional parts are electrically conductively connected to corresponding nodes and/or the respective functional parts itself provide the corresponding nodes. As an example, a source/drain node of a field-effect transistor memory structure may be electrically conductively connected to the source-line node of the memory cell or the source/drain node of the field-effect transistor memory structure may provide the source-line node of the memory cell. As another example, a source/drain node of the field-effect transistor memory structure may be electrically conductively connected to the bitline node of the memory cell or the source/drain node of the field-effect transistor memory structure may provide the bitline node of the memory cell.

The term "voltage" may be used herein with respect to "one or more bitline voltages", "one or more wordline voltages", "one or more plateline voltages", "one or more sourceline voltages", "one or more control line voltages", "one or more base voltages" and the like. As an example, the term "base voltage" may be used herein to denote a reference voltage and/or a reference potential for the circuit. With respect to an electrical circuit, the base voltage may be also referred to as ground voltage, ground potential, virtual ground voltage, or zero volts (0 V). The base voltage of an electrical circuit may be defined by the power supply used to operate the electronic circuit. In the figures, the base voltage is exemplarily indicated using the ground symbol (also referred to as earth symbol). As another example, the term "control line voltage" may be used herein to denote a voltage that is provided to a control line, e.g., of a memory cell arrangement (for example a "wordline voltage" may be provided to a "wordline", a "bitline voltage" may be provided to a bitline, and a "sourceline voltage" may be provided to a sourceline). The sign of a voltage difference (e.g., a voltage drop) may be defined as a potential inside a memory cell (e.g., at a first electrode portion) minus a potential at a second electrode portion of the memory cell.

Illustratively, a voltage provided to a node or a terminal may assume any suitable value depending on the intended operation of the circuit including the node or terminal. For example, a bitline voltage (referred to as $V_{BL}$ or VBL) may be varied depending on the intended operation of the memory cell arrangement. Analogously, a wordline voltage (referred to as $V_{WL}$ or VWL), a plateline voltage (referred to as $V_{PL}$ or VPL), and/or plateline voltage (referred to as $V_{PL}$ or VPL) may be varied depending on the intended operation of a memory cell arrangement. A voltage provided to a node or terminal may be defined by the respective potential applied to that node or terminal relative to the base voltage (referred to as $V_B$) of the circuit. Further, a voltage drop associated with two distinct nodes or terminals of a circuit may be defined by the respective voltages/potentials applied at the two nodes or terminals. As an example, a bitline voltage drop associated with a memory cell of a memory cell arrangement (e.g., an electrode of the memory cell) may be defined by the respective voltages/potentials applied at the corresponding memory cell (e.g., the electrode of the memory cell). A voltage drop over (short: a voltage over) over a component may also be referred to as a "voltage across" the component. Thus, a "voltage across" a component may be used herein to denote a voltage drop from a node on one side of a component (e.g. one side of a capacitor) to a node on the other side of the component (e.g., the other side of the capacitor).

The term "region" used with regards to a "source region", "drain region", "channel region", and the like, may be used herein to mean a continuous region of a semiconductor portion (e.g., of a semiconductor wafer or a part of a semiconductor wafer, a semiconductor layer, a fin, a semiconductor nanosheet, a semiconductor nanowire, etc.) In some aspects, the continuous region of a semiconductor portion may be provided by semiconductor material having only one dominant doping type.

In some aspects, two voltages may be compared with one another by relative terms such as "greater", "higher", "lower", "less", or "equal", for example. It is understood that, in some aspects, a comparison may include the sign (positive or negative) of the voltage value or, in other aspects, the absolute voltage values (also referred to as the magnitude, or as the amplitude, e.g., of a voltage pulse) are considered for the comparison.

The terms "charging" or "discharging" an element having a capacitance associated therewith (such as a control line, a terminal, a capacitor (e.g., a capacitive memory element), etc., in an electronic circuit) may be used herein with respect to increase (in case of charging) or decrease (in case of discharging) the amount of electric charge stored in the element, for example. The electric charge stored in the element (based on the capacitance associated therewith) may be changed via a charging current or discharging current accordingly. In the case that an element having a capacitance associated therewith has an amount of electric charge stored therein, a corresponding voltage may be associated therewith as well. The relationship between a voltage of an element having a capacitance associated therewith (e.g., of a capacitor or an element having an inherent capacitance) and the electric charge stored therein may be determined based on commonly used equations considering the capacitance as a ratio of a change in electric charge to a corresponding change in the electric potential. The terms "charging" or "discharging" with reference to an element having a capacitance associated therewith may be used herein with respect to a technical current direction. The term "charge" or "charging" with reference to an element having a capacitance associated therewith, such as a control line, may be used herein to mean an increase of a voltage value being present (e.g., measurable) at the element, e.g., at the control line. The increase of the voltage value may be understood as a more positive voltage value: For example, an element having a capacitance associated therewith may be charged from a voltage value of −8V to a voltage value of −4V, from a voltage value of −2V to a voltage value of 2V, or from a voltage value of 3V to a voltage value of 6V (only as numerical examples). The term "discharge" or "discharging" with reference to an element having a capacitance associated therewith, such as a control line, may be used herein to mean a decrease of a voltage value being present (e.g., measurable) at the element, e.g., at the control line. The decrease of the voltage value may mean a more negative voltage value: For example, an element having a capacitance associated therewith may be discharged from a voltage value of 8V to a voltage value of 4V, from a voltage value of 2V to a voltage value of −2V, or from a voltage value of −3V to a voltage value of −6V (only as numerical examples).

The phrase "a current between" a first terminal or node and a second terminal or node may be used herein to mean a current from the first terminal or node to the second terminal or node as well as a current from the second terminal or node to the first terminal or node.

The phrase "a current through" a terminal, node, or region may be used herein to mean a current from the terminal or node to another terminal, another node, or another region as well as a current to the terminal, node, or region (e.g., from another terminal, another node, or another region).

A current may be detected using a current sense amplifier that outputs a voltage proportional to the current.

The terms "electrically conducting" or "electrically conductive" may be used herein interchangeably to describe a material or a layer having an electrical conductivity or an average electrical conductivity greater than $10^6$ S/m at a temperature of 20° C. The term "electrically insulating" may be used herein interchangeably to describe a material or a layer having an electrical conductivity or an average electrical conductivity less than $10^{-10}$ S/m at a temperature of 20° C. In some aspects, a difference in electrical conductivity between an electrically conducting material (or layer) and an electrically insulating material (or layer) may have an absolute value of at least $10^{10}$ S/m at a temperature of 20° C., or of at least $10^{15}$ S/m at a temperature of 20° C.

It may be understood, that the physical term "electrical conductivity" (also referred to as specific conductance, specific electrical conductance, as examples) may be defined as a material dependent property reciprocal to the physical term "electrical resistivity" (also referred to as specific electrical resistance, volume resistivity, as examples). Further properties of a layer or structure may be defined material dependent and the geometry dependent, e.g., by the physical terms "electrical resistance" and "electrical conductance".

The terms "at least one" and "one or more" may be understood to include any integer number greater than or equal to one, i.e. one, two, three, four, [ . . . ], etc. The term "a plurality" or "a multiplicity" may be understood to include any integer number greater than or equal to two, i.e. two, three, four, five, [ . . . ], etc. The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The phrase that an element or a group of elements "includes" another element or another group of elements may be used herein to mean that the other element or other group of elements may be part of the element or the group of elements or that the element or the group of elements may be configured or formed as the other element or the other group of elements (e.g., the element may be the other element).

The phrase "unambiguously assigned" may be used herein to mean a one-to-one-assignment (e.g., allocation, e.g., correspondence) or a bijective assignment. As an example, a first element being unambiguously assigned to a second element may include that the second element is unambiguously assigned to the first element. As another example, a first group of elements being unambiguously assigned to a second group of element may include that each element of the first group of elements is unambiguously assigned to a corresponding element of the second group of elements and that that corresponding element of the second group of elements is unambiguously assigned to the element of the first group of elements.

It is noted that one or more functions described herein with reference to a memory cell, a memory cell arrangement, etc., may be accordingly part of a method, e.g., part of a method for operating a memory cell arrangement. Vice versa, one or more functions described herein with reference to a method, e.g., with reference to a method for operating a memory cell arrangement, may be implemented accordingly in a device or in a part of a device, for example, in a memory cell, a memory cell arrangement, etc.

While the invention has been particularly shown and described with reference to specific aspects, it should be understood by those skilled in the art that various changes in form and detail may be made therein without departing from the spirit and scope of the invention as defined by the appended claims. The scope of the invention is thus indicated by the appended claims and all changes, which come within the meaning and range of equivalency of the claims, are therefore intended to be embraced.

What is claimed is:

1. A memory cell arrangement, comprising:
- a plurality of bitlines;
- a plurality of wordlines;
- a plurality of platelines;
- a plurality of capacitive memory cells, wherein each capacitive memory cell of the plurality of capacitive memory cells is connected to and selectively addressable by a corresponding bitline of the plurality of bitlines, a corresponding wordline of the plurality of wordlines, and a corresponding plateline of the plurality of platelines;
- a control circuit configured to carry out a read-out operation to read out a memory state of a capacitive memory cell of the plurality of capacitive memory cells by addressing the capacitive memory cell via its corresponding bitline, corresponding wordline, and corresponding plateline, wherein, for carrying out the read-out operation, the control circuit is configured to:
  - charge the corresponding bitline to a first characteristic voltage by applying a plateline voltage having a first plateline read voltage value at the corresponding plateline and by applying a wordline voltage at the corresponding wordline;
  - decrease the plateline voltage from the first plateline read voltage value to a second plateline read voltage value to thereby discharge the corresponding bitline from the first characteristic voltage to a second characteristic voltage; and
  - determine the memory state of the capacitive memory cell based on sensing the second characteristic voltage.

2. The memory cell arrangement according to claim 1, wherein the control circuit comprises a sense amplifier for sensing the characteristic voltage and determining the memory state based on the characteristic voltage.

3. The memory cell arrangement according to claim 1, wherein the read-out operation comprises that the corresponding bitline is charged for a predefined signal development time interval and that the plateline voltage is decreased from the first plateline read voltage value to the second plateline read voltage value after the predefined signal development time interval.

4. The memory cell arrangement according to claim 1, wherein the read-out operation comprises that plateline voltage is applied by charging the corresponding plateline to the second plateline read voltage value in a first plateline charging time interval and by charging the corresponding plateline from the second plateline read voltage value to the first plateline read voltage value in a second plateline charging time interval after the first plateline charging time interval.

5. The memory cell arrangement according to claim 1, wherein the control circuit is further configured to carry out a write operation to set a memory state of the capacitive memory cell by addressing the capacitive memory cell via its corresponding bitline, corresponding wordline, and corresponding plateline, wherein the write operation comprises applying a plateline voltage having the second plateline read voltage value at the corresponding plateline.

6. The memory cell arrangement according to claim 1, further comprising:
- a first power supply configured to supply the plateline voltage having the first plateline read voltage value; and
- a second power supply configured to supply the plateline voltage having the second plateline read voltage value.

7. The memory cell arrangement according to claim 1, wherein read-out operation comprises that the memory state of the capacitive memory cell is determined by comparing the second characteristic voltage to a base voltage.

8. The memory cell arrangement according to claim 7, wherein the base voltage is a ground voltage.

9. The memory cell arrangement according to claim 1, wherein each capacitive memory cell of the plurality of capacitive memory cells is a remanent-polarizable memory cell.

10. A memory cell arrangement, comprising:
- a bitline, a wordline, and a plateline;
- a capacitive memory cell connected to and addressable via the bitline, the wordline, and the plateline;
- a control circuit configured to carry out a read-out operation to read out a memory state of the capacitive memory cell, wherein, for carrying out the read-out operation, the control circuit is configured:
  - charge the bitline to a first characteristic voltage by applying a plateline voltage having a first plateline read voltage value at the plateline and by applying a wordline voltage at the corresponding wordline;
  - decrease the plateline voltage from the first plateline read voltage value to a second plateline read voltage value to thereby discharge the corresponding bitline from the first characteristic voltage to a second characteristic voltage; and
  - determine the memory state of the capacitive memory cell based on sensing the second characteristic voltage.

11. The memory cell arrangement according to claim 10, wherein the read-out operation comprises that plateline voltage is applied by charging the plateline to the second plateline read voltage value in a first plateline charging time interval and by charging the plateline from the second plateline read voltage value to the first plateline read voltage value in a second plateline charging time interval after the first plateline charging time interval.

12. The memory cell arrangement according to claim 10, wherein the control circuit is further configured to carry out a write operation to set a memory state of the capacitive memory cell by addressing the capacitive memory cell via its bitline, wordline, and plateline, wherein the write operation comprises applying a plateline voltage having the second plateline read voltage value at the corresponding plateline.

13. The memory cell arrangement according to claim 10, wherein read-out operation comprises that the memory state of the capacitive memory cell is determined by comparing the second characteristic voltage to a base voltage.

14. A method of reading a capacitive memory cell which is connected to a bitline, a plateline, and a wordline, the method comprising:

charging the bitline to a first characteristic voltage by applying a plateline voltage having a first plateline read voltage value at the plateline and by applying a wordline voltage at the wordline;

decreasing the plateline voltage from the first plateline read voltage value to a second plateline read voltage value to thereby discharge the bitline from the first characteristic voltage to a second characteristic voltage; and determining a memory state of the capacitive memory cell based on sensing the second characteristic voltage.

15. The method according to claim 14, wherein the bitline is charged for a predefined signal development time interval and the plateline voltage is decreased from the first plateline read voltage value to the second plateline read voltage value after the predefined signal development time interval.

16. The method according to claim 14, wherein the plateline voltage is applied by charging the plateline to the second plateline read voltage value in a first plateline charging time interval and by charging the plateline from the second plateline read voltage value to the first plateline read voltage value in a second plateline charging time interval after the first plateline charging time interval.

17. The method according to claim 14, further comprising:

writing the memory cell into a memory state by applying a plateline voltage having the second plateline read voltage value at the plateline.

18. The method according to claim 14, wherein the memory state of the capacitive memory cell is determined by comparing the second characteristic voltage to a base voltage.

19. The method according to claim 18, wherein the base voltage is a ground voltage.

20. The method according to claim 14, wherein the capacitive memory cell is a remanent-polarizable memory cell.

* * * * *